United States Patent
Suzuki et al.

(10) Patent No.: US 8,535,551 B2
(45) Date of Patent: Sep. 17, 2013

(54) PLASMA ETCHING METHOD

(75) Inventors: Takefumi Suzuki, Tokyo (JP); Tatsuya Sugimoto, Tokyo (JP); Masahiro Nakamura, Tokyo (JP)

(73) Assignee: Zeon Corporation, Chiyoda-Ku (JP)

( * ) Notice: Subject to any disclaimer, the term of this patent is extended or adjusted under 35 U.S.C. 154(b) by 242 days.

(21) Appl. No.: 12/733,828

(22) PCT Filed: Sep. 26, 2008

(86) PCT No.: PCT/JP2008/067398
§ 371 (c)(1),
(2), (4) Date: Jun. 25, 2010

(87) PCT Pub. No.: WO2009/041560
PCT Pub. Date: Apr. 2, 2009

(65) Prior Publication Data
US 2010/0264116 A1    Oct. 21, 2010

(30) Foreign Application Priority Data
Sep. 28, 2007 (JP) ................. 2007-255199

(51) Int. Cl.
*C03C 15/00* (2006.01)
*H01L 21/461* (2006.01)

(52) U.S. Cl.
USPC ............. 216/67; 216/79; 216/80; 438/723; 438/743

(58) Field of Classification Search
USPC ............. 216/79, 80, 67; 438/723, 743
See application file for complete search history.

(56) References Cited

U.S. PATENT DOCUMENTS

| 5,935,877 | A | 8/1999 | Autryve |
| 6,461,975 | B1 | 10/2002 | Jeong et al. |
| 6,969,568 | B2 * | 11/2005 | Rauf et al. ............ 430/5 |
| 2005/0247670 | A1 * | 11/2005 | Yamada et al. ........ 216/67 |
| 2006/0213616 | A1 | 9/2006 | Ogasawara |

FOREIGN PATENT DOCUMENTS

| EP | 0948033 A1 | 10/1999 |
| EP | 948033 A1 * | 10/1999 |
| JP | 07-147273 A | 6/1995 |
| JP | 09-148314 A | 6/1997 |
| JP | 2006-278436 A | 10/2006 |

OTHER PUBLICATIONS

Supplementary European Search Report dated May 25, 2011, issued for the corresponding European patent application No. 08834441.1.
International Search Report dated Dec. 9, 2008, issued on PCT/JP2008/067398.

* cited by examiner

*Primary Examiner* — Binh X Tran
(74) *Attorney, Agent, or Firm* — Edwards Wildman Palmer LLP; James E. Armstrong, IV; Nicholas J. DiCeglie, Jr.

(57) ABSTRACT

A plasma etching method includes plasma-etching a silicon oxide layer through a mask using a process gas, the process gas containing oxygen gas and a fluorohydrocarbon shown by the formula (1), $C_xH_yF_z$, wherein x is an integer from 4 to 6, y is an integer from 1 to 4, and z is a positive integer, provided that (y+z) is 2x or less. A contact hole having a very small diameter and a high aspect ratio can be formed in a substantially vertical shape without necking by plasma-etching the silicon oxide layer using a single process gas.

5 Claims, No Drawings

PLASMA ETCHING METHOD

TECHNICAL FIELD

The present invention relates to a method of plasma-etching a silicon oxide layer through a mask using a process gas.

BACKGROUND ART

In a semiconductor production process, a hole (e.g., contact hole) is formed by plasma-etching a specific area of a silicon oxide layer formed on a substrate. When forming such a hole, the open area of the hole tends to have a blocked shape (i.e., necking tends to occur). In recent years, contact holes tend to be reduced in diameter and increased in aspect ratio due to miniaturization of semiconductor devices. Therefore, development of technology for forming a contact hole having a very small diameter and a high aspect ratio in a substantially vertical shape without necking has been desired.

Patent Document 1 discloses a method of forming a contact hole having a very small diameter and a high aspect ratio in a substantially vertical shape by selectively utilizing two or more etching gases (process gases) containing a fluorocarbon.

However, since the method disclosed in Patent Document 1 requires use of two or more process gases, a complicated gas switching operation is necessary. Therefore, the method disclosed in Patent Document 1 is not satisfactory from the viewpoint of industrial production efficiency.

Patent Document 1: JP-A-2006-278436

DISCLOSURE OF THE INVENTION

Problems to be Solved by the Invention

The present invention has been achieved in view of the above situation, and has an object of providing a plasma etching method which can form a contact hole having a very small diameter and a high aspect ratio in a substantially vertical shape without necking by utilizing a single process gas (i.e., without requiring a gas switching operation).

Means for Solving the Problems

As a result of extensive studies to achieve the above object, the inventors of the present invention have found that a contact hole having a very small diameter and a high aspect ratio can be formed in a substantially vertical shape without necking by plasma-etching a silicon oxide layer formed on a substrate through a mask using a process gas containing oxygen gas and a specific fluorohydrocarbon.

According to the present invention, there is provided a plasma etching method comprising plasma-etching a silicon oxide layer through a mask using a process gas, the process gas containing oxygen gas and a fluorohydrocarbon shown by the formula (1), $C_xH_yF_z$, wherein x is an integer from 4 to 6, y is an integer from 1 to 4, and z is a positive integer, provided that (y+z) is 2x or less.

In the plasma etching method of the present invention, the process gas preferably contains at least one Group 18 gas selected from the group consisting of helium, argon, neon, krypton, and xenon.

In the plasma etching method of the present invention, the fluorohydrocarbon gas shown by the formula (1) is preferably a compound having an unsaturated bond, and more preferably a compound having an unsaturated bond, and a hydrogen atom which is bonded to at least one carbon atom which forms the unsaturated bond.

Effects of the Invention

According to the method of the present invention, a contact hole having a very small diameter and a high aspect ratio can be formed in a substantially vertical shape without necking. Since the method of the present invention utilizes a single process gas, a complicated gas switching operation is unnecessary.

BEST MODE FOR CARRYING OUT THE INVENTION

The present invention is described below in detail.

The plasma etching method of the present invention includes plasma-etching a silicon oxide layer through a mask using a process gas which contains oxygen gas and a fluorohydrocarbon shown by the formula (1), $C_xH_yF_z$.

1) Process Gas

In the plasma etching method of the present invention, a gas containing oxygen gas and a fluorohydrocarbon shown by the formula (1), $C_xH_yF_z$ (hereinafter may be referred to as "fluorohydrocarbon (1)") is used as the process gas.

In the formula (1), x is an integer from 4 to 6, y is an integer from 1 to 4, and z is a positive integer, provided that (y+z) is 2x or less.

The content of the fluorohydrocarbon (1) in the process gas is usually 1 to 10 vol %, preferably 1 to 6 vol %, and more preferably 2 to 6 vol %.

There are no particular limitations to the fluorohydrocarbon (1) insofar as the requirements for x, y, and z mentioned above are satisfied. Examples of the fluorohydrocarbon (1) include cyclofluoroalkenes such as 1,3,3,4,4-pentafluorocyclobutene, 3,3,4,4-tetrafluorocyclobutene, 1,3,3,4,4,5,5-heptafluorocyclopentene, 1,3,4,4,5,5-hexafluorocyclopentene, 1,2,3,4,4,5,5-heptafluorocyclopentene, 3,3,4,4,5,5-hexafluorocyclopentene, and 1,3,4,4,5,5,6,6-octafluorocyclohexene;

linear fluoroalkenes such as 1,2,3,3,4,4,4-heptafluoro-1-butene, 1,1,3,3,4,4,4-heptafluoro-1-butene, 1,1,1,2,4,4,4-heptafluoro-2-butene, 1,2,3,3,4,4,5,5,5-nonafluoro-1-pentene, 1,1,3,3,4,4,5,5,5-nonafluoro-1-pentene, 1,1,1,3,4,4,5,5,5-nonafluoro-2-pentene, 1,1,1,2,4,4,5,5,5-nonafluoro-2-pentene, and 1,1,1,4,4,5,5,5-octafluoro-2-pentene;

fluoroalkynes such as 3,3,3-trifluoro-1-propyne, 3,3,4,4,4-pentafluoro-1-butyne, 3-trifluoromethyl-3,4,4,4-tetrafluoro-1-butyne, and 3,3,4,4,5,5,5-heptafluoro-1-pentyne;

fluorodienes such as 1,3,4,4,4-pentafluoro-1,2-butadiene, 1,1,4,4,4-pentafluoro-1,2-butadiene, 1,2,3,4,4-pentafluoro-1,3-butadiene, 1,1,3,4,4-pentafluoro-1,3-butadiene, 1,3,4,4,5,5,5-heptafluoro-1,2-pentadiene, 1,1,4,4,5,5,5-heptafluoro-1,2-pentadiene, 1,2,3,4,5,5,5-heptafluoro-1,3-pentadiene, 1,1,3,4,5,5,5-heptafluoro-1,3-pentadiene, 1,1,2,4,5,5,5-heptafluoro-1,3-pentadiene, 1,1,2,3,5,5,5-heptafluoro-1,3-pentadiene, 1,2,3,3,4,5,5-heptafluoro-1,4-pentadiene, 1,1,3,3,4,5,5-heptafluoro-1,4-pentadiene, and 1,1,1,4,5,5,5-heptafluoro-2,3-pentadiene;

cyclofluoroalkanes such as 1,2,2,3,3,4,4-heptafluorocyclobutane, 1,2,3,3,4,4-hexafluorocyclobutane, 2,2,3,3,4,4-hexafluorocyclobutane, 1,2,2,3,3,4,4,5,5-nonafluorocyclopentane, 1,2,3,3,4,4,5,5-octafluorocyclopentane, 2,2,3,3,4,4,5,5-octafluorocyclopentane, and 1,2,2,3,3,4,4,5,5-nonafluorocyclohexane; and the like.

These fluorohydrocarbons (1) may be used either individually or in combination. It is preferable to use one fluorohydrocarbon in order to more markedly achieve the effect of the present invention.

Among the above-described fluorohydrocarbons, in order to form a contact hole having a very small diameter and a high aspect ratio in a substantially vertical shape without necking, a compound having an unsaturated bond is preferable, a compound having a hydrogen atom which is bonded to at least one carbon atom which forms the unsaturated bond is more preferable, and 1,3,3,4,4,5,5-heptafluorocyclopentene, 1,1,1,2,4,4,5,5,5-nonafluoro-2-pentene, and 1,1,1,3,4,4,5,5,5-nonafluoro-2-pentene are particularly preferable.

Many of the fluorohydrocarbons (1) used in the present invention are known compounds, and can be prepared by a known method.

1,3,3,4,4,5,5-Heptafluorocyclopentene can be produced by, for example, the method described in the Journal of the American Chemical Society, 1964, Vol. 86, 5361.

1,1,1,3,4,4,5,5,5-Nonafluoro-2-pentene can be produced by, for example, the method described in the Journal of Fluorine Chemistry, 2003, Vol. 123, 227.

When using the fluorohydrocarbon (1) for plasma etching described later, an arbitrary container such as a cylinder used for a semiconductor process gas is filled with the fluorohydrocarbon (1).

The purity of the fluorohydrocarbon (1) (gas) used in the present invention is preferably 99 vol % or more, more preferably 99.9 vol % or more, and particularly preferably 99.98 vol % ore more. The effect of the present invention is improved when the above purity requirement is satisfied. If the purity of the fluorohydrocarbon (1) is too low, there is a potential for bias of the gas purity (content of fluorohydrocarbon (1)) in the container filled with the gas. Specifically, the gas purity when the remaining gas has decreased may significantly differ from the gas purity in the initial stage of use.

In such a case, there is a large difference in performance between plasma etching in the initial stage and in the stage when the amount of the remaining gas has decreased, which may lead to a yield reduction in the production line. Therefore, since a purity increase reduces the gas purity bias in the container, there is no difference in performance between the initial stage of use and the stage when the remaining amount of gas has become small. It is thus possible to use gas without futility.

The content (purity) of the fluorohydrocarbon (1) is a purity on a volume basis derived from the weight percentage determined by gas chromatography analysis by an internal standard substance method.

The fluorohydrocarbon (1) may contain impurities such as air, nitrogen gas in the production facilities, solvents used in the production, moisture derived from a hygroscopic base and alkali, and the like as trace components. The content of the nitrogen gas, moisture, and the like is preferably as small as possible. One reason is that impurities such as nitrogen, oxygen, and moisture dissociate in the plasma container and produce various free radicals (etch species) which significantly affect the plasma reaction of the fluorohydrocarbon (1). A second reason is that if the amount of nitrogen gas exceeds a certain level, the plasma reaction of the fluorohydrocarbon (1) changes from dissociation into free radicals to polymerization, and produces polymer deposits. A third reason is that the vaporization rate of nitrogen gas, oxygen gas, moisture and the like significantly fluctuates over time when the fluorohydrocarbon (1) is extracted from the container and makes it difficult to stably conduct the plasma reaction under constant conditions.

Therefore, the total amount of oxygen gas and nitrogen gas included in the fluorohydrocarbon (1) as residual trace gas is preferably 200 vol ppm or less, more preferably 150 vol ppm or less, and particularly preferably 100 vol ppm or less. In addition, the content of moisture is preferably 30 wt ppm or less, more preferably 20 wt ppm or less, and particularly preferably 10 wt ppm or less.

The total amount of oxygen gas and nitrogen gas refers to the content (ppm) by volume of oxygen gas and nitrogen gas determined by gas chromatography analysis by the absolute calibration curve method. The volume basis is equivalent to a mol basis. The moisture content is a water content (ppm) on the weight basis usually determined by the Karl Fisher method.

In the present invention, oxygen gas is further used as the process gas. Oxygen gas has a function of preventing etching stop which is considered to be caused by accumulation of reaction products in the bottom of the hole.

The amount of oxygen gas used on the basis of the ratio by volume to the fluorohydrocarbon (1) gas is preferably 0.1 to 50, and more preferably 0.5 to 30.

Since a gas containing fluorohydrocarbon (1) is used as a process gas in the present invention, a high selectivity ratio of a silicon oxide layer to resist etching can be obtained.

The selectivity ratio to resist etching refers to (average etching rate of silicon oxide layer)/(average etching rate of resist). A "high selectivity ratio to resist etching" may be, in other words, "a property of having etching selectivity to resist". Since the fluorohydrocarbon (1) has etching selectivity, it is possible to efficiently perform etching of a silicon oxide layer without destroying a resist.

In the present invention, the fluorohydrocarbon (1) makes it possible to form a contact hole having a very small diameter and a high aspect ratio in a substantially vertical shape without necking by utilizing a single process gas. The fluorohydrocarbon (1) is decomposed in plasma into a composition including carbon atoms and fluorine atoms, of which the structure is unknown. The composition is thought to form a film on the surface of a mask (resist) to protect the mask. For this reason, the oxygen gas content in the process gas can be increased while maintaining high etching selectivity.

In the present invention, the process gas preferably further contains at least one Group 18 gas selected from helium, argon, neon, krypton, and xenon. The concentration and ion energy of active species generated in plasma can be controlled by using these Group 18 gases in a combination, whereby formation of a hole having a substantially vertical shape without necking is ensured. The Group 18 gases may be used either individually or in combination.

The Group 18 gas is used in an amount such that the process gas substantially consists of the fluorohydrocarbon (1) gas, oxygen, and the Group 18 gas. Specifically, the amount of the Group 18 gas on the basis of the ratio by volume to the fluorohydrocarbon (1) gas is preferably 2 to 200, and more preferably 5 to 150.

2) Plasma Etching Method

The term "etching" used in the plasma etching method of the present invention refers to technology of etching a processing target used in a semiconductor production process or the like to form a highly integrated fine pattern. The term "plasma etching" refers to performing etching by utilizing a chemical reaction caused by decomposition of a gaseous compound into chemically active ions, electrons, and radicals, which chemical reaction occurs when a glow discharge is produced by applying a high-frequency electric field to a process gas (reactive plasma gas).

The processing target in the present invention is a silicon oxide layer. The silicon oxide layer is usually formed on a substrate. As examples of the substrate, a glass substrate, a silicon single crystal wafer, a gallium arsenide substrate, and the like can be given.

In the present invention, specific areas of the silicon oxide layer are plasma-etched using a resist pattern formed on the silicon oxide layer as a mask. The resist pattern may be formed by, for example, forming a film of a photosensitive resist composition on the silicon oxide layer, and exposing the film to radiation with a wavelength of 195 nm or less through a mask pattern.

In the plasma etching method of the present invention, the silicon oxide layer (processing target) on which the resist pattern is formed is placed in a chamber (etching chamber) equipped with a plasma generator. After degassing the chamber to vacuum, oxygen gas, fluorohydrocarbon (1) gas, and optionally Group 18 gas, which are the components of the process gas, are introduced into the chamber at a rate respectively predetermined for each gas to make a predetermined pressure.

The feed rate of each gas may be proportional to the amount of each gas. For example, the fluorohydrocarbon (1) gas is fed at a rate of $8.45\times10^{-4}$ to $5.07\times10^{-3}$ Pa·m$^3$/sec, the oxygen gas is fed at a rate of $1.69\times10^{-3}$ to $8.45\times10^{-3}$ Pa·m$^3$/sec, and the Group 18 gas fed at a rate of $1.69\times10^{-2}$ to $8.45\times10^{-2}$ Pa·m$^3$/sec.

The pressure inside the chamber into which the process gas is introduced is usually 0.0013 to 1300 Pa, preferably 0.13 to 3 Pa, and more preferably 0.13 to 2 Pa.

Next, a high-frequency electric field is applied to the fluorohydrocarbon (1) gas (reactive plasma gas) in the chamber using the plasma generator to cause a glow discharge to occur, thereby generating plasma.

As examples of the plasma generator, a helicon wave plasma generator, an inductively coupled plasma generator, a capacitive coupled plasma generator, a magnetron plasma generator, a microwave plasma generator, and the like can be given. A helicon wave plasma generator, an inductively coupled plasma generator, and a microwave plasma generator are preferably used from the viewpoint of ease of high-density plasma generation.

Although there are no particular limitations to the plasma density, plasma etching in a high-density plasma atmosphere of preferably $10^{12}$ species/cm$^3$ or more, and more preferably $10^{12}$ to $10^{13}$ species/cm$^3$, is desirable in order to advantageously achieve the effect of the present invention. A decrease in selectivity has been experienced at a high plasma density of $10^{12}$ species/cm$^3$ or more when a general fluorohydrocarbon compound was used. However, when the fluorohydrocarbon (1) of the present invention is used, etching can be performed at a high etching rate while ensuring high selectivity to efficiently form a fine pattern.

Although there are no particular limitations to the maximum achieving temperature of the substrate during etching, the maximum temperature of the substrate is preferably 0 to 300° C., more preferably 60 to 250° C., and still more preferably 80 to 200° C. The temperature of the substrate may be either controlled or not controlled by cooling or the like.

The etching time is usually 5 to 10 minutes. When using the process gas of the present invention, a high speed etching of 2 to 5 minutes is possible so that productivity can be improved.

According to the plasma etching method of the present invention, a contact hole having a very small diameter and a high aspect ratio without necking can be efficiently formed in a simple manner using a single process gas.

EXAMPLES

The present invention is described below in more detail by way of examples. Note that the present invention is not limited to the following examples. In the examples, part(s) refers to part(s) by weight unless otherwise indicated.

The content of the fluorohydrocarbon (1) in the process gas was determined by gas chromatography (GC).
The GC analysis conditions were as follows.
Equipment: "HP6890" manufactured by Hewlett-Packard
Column: NEUTRA BOND-1, length 60 m/ID 25 μm/film 1.50 μm
Detector: FID
Injection temperature: 150° C.
Detector temperature: 250° C.
Carrier gas: nitrogen gas (23.2 ml/min)
Make-up gas: nitrogen gas (30 ml/min), hydrogen gas (50 ml/min), air (400 ml/min)
Split ratio: 137/1
Heating program: (1) maintained at 40° C. for 20 min, (2) heated at a rate of 40° C./min, and (3) maintained at 250° C. for 14.75 min.

Preparation Example 1

1,3,3,4,4,5,5-Heptafluorocyclopentene was synthesized according to the method described in the Journal of the American Chemical Society, 1964, Vol. 86, 5361.

Specifically, a four-necked glass container equipped with a stirrer and a dropping funnel was charged with 700 parts of anhydrous triethylene glycol dimethyl ether (manufactured by Aldrich) and 300 parts of octafluorocyclopentene (manufactured by SynQuest Laboratories). The container was immersed in an acetone/dry ice bath to cool to −30° C. 62 parts of a triethylene glycol dimethyl ether solution of sodium borohydride (concentration: 2 mol/l) was added dropwise to the mixture using the dropping funnel. After the addition, the mixture was stirred at −30 to −20° C. for two hours, and allowed to come to room temperature for six hours with stirring.

After completion of the reaction, 1500 parts of water was added to the reaction solution in small portions to allow the reaction solution to separate into two layers. The lower layer was extracted, washed with a saturated aqueous sodium bicarbonate solution, and dried over anhydrous magnesium sulfate. After removing magnesium sulfate by filtration, the filtrate was rectified using a KS-type distillation column (manufactured by Toka Seiki Co., Ltd, theoretical plate number: 30) to obtain 178 parts of the target compound, 1,3,3,4,4,5,5-heptafluorocyclopentene.

A 150 ml cylinder made of 316SS which had been dried under vacuum was filled with the resulting purified 1,3,3,4,4,5,5-heptafluorocyclopentene through a filter. The cylinder was immersed in a cooling medium maintained at −196° C., and a valve was connected to a vacuum line. The valve was opened for five seconds to extract nitrogen and oxygen from the cylinder. The cylinder was allowed to come to room temperature, then immersed again in the cooling medium maintained at −196° C., followed by extraction of oxygen and nitrogen. This operation was repeated five times to obtain a plasma reaction gas contained in the cylinder. The content of 1,3,3,4,4,5,5-heptafluorocyclopentene in the plasma reaction gas was analyzed to find that the content was 99.2 vol %.

Example 10 parts of a ternary copolymer of 2,2,2-trifluoromethyl methacrylate, 2-ethyladamantyl methacrylate, and t-butyl methacrylate (copolymerization ratio: 0.4:0.35:0.25 (molar ratio), molecular weight: 8700) and 0.15 parts of triphenylsulfonium methanesulfonate as photo-acid-generating agent were dissolved in 70 parts of propylene glycol monomethyl ether acetate. The solution was filtered through a filter with a pore diameter of 100 nm to prepare a resist solution. The resist solution was spin-coated onto an 8 inch silicon substrate having a silicon oxide layer with a thickness of 2 μm formed thereon. The resist solution was prebaked on a hot plate at 120° C. to form a resist film with a thickness of 18,000 nm. The resist film was exposed using an X-ray exposure apparatus through a mask pattern, post-baked at 130° C., developed at 25° C. for 60 seconds in a 2.38 wt % tetramethylammonium hydroxide aqueous solution, and dried to obtain a resist pattern with a thickness of 600 nm.

The resulting substrate was placed in an etching chamber of a capacitive coupled plasma etching apparatus. After degassing the system to vacuum, the plasma reaction gas prepared in Preparation Example 1 was fed to the etching chamber at a rate of 20 sccm, followed by further feeding oxygen gas and argon gas respectively at a rate of 36 sccm and 300 sccm. Plasma etching was performed at a plasma density of $10^{12}$ species/cm$^3$ while maintaining the pressure in the system at 2 Pa.

The etching rate, the selectivity (selectivity ratio) to resist, and the pattern shape are shown in Table 1.

Comparative Example

An experiment was carried out in the same manner as in Example 1, except that hexafluoro-1,3-butadiene was used instead of 1,3,3,4,4,5,5-heptafluorocyclopentene, and oxygen gas was introduced into the etching chamber at a rate of 18 sccm. The etching rate, the selectivity (selectivity ratio) to resist, and the pattern shape are shown in Table 1.

TABLE 1

| | | | Example | Comparative Example |
|---|---|---|---|---|
| Etching rate | Silicon oxide layer | nm/min | 467 | 491 |
| | Mask | nm/min | 30 | 59 |
| | Selectivity ratio | | 15.5 | 8.3 |
| Pattern shape | | | Good | Necking in the upper part |

As can be seen from Table 1, when comparing plasma etching using the fluorohydrocarbon (1) (Example) and plasma etching using a related-art process gas (Comparative Example), plasma etching of the Example exhibited better selectivity and could form holes with a better shape without necking.

The invention claimed is:

1. A plasma etching method comprising plasma-etching a silicon oxide layer through a mask using a process gas, the process gas consisting essentially of oxygen gas, 1,3,3,4,4,5,5-heptafluorocyclopentene, and, optionally, at least one Group 18 gas selected from the group consisting of helium, argon, neon, krypton, and xenon, wherein the ratio by volume of oxygen gas to the 1,3,3,4,4,5,5-heptafluorocyclopentene is from 0.5 to 30.

2. The method according to claim 1, wherein the content of the 1,3,3,4,4,5,5-heptafluorocyclopentene in the process gas is 1 to 10 vol %.

3. A plasma etching method comprising plasma-etching a silicon oxide layer through a mask using a process gas, the process gas consisting essentially of oxygen gas, 1,3,3,4,4,5,5-heptafluorocyclopentene, and at least one Group 18 gas selected from the group consisting of helium, argon, neon, krypton, and xenon, wherein the ratio by volume of oxygen as to the 1,3,3,4,4,5,5-heptafluorocyclopentene is from 0.5 to 30.

4. The method according to claim 3, wherein the ratio by volume of the Group 18 gas to the 1,3,3,4,4,5,5-heptafluorocyclopentene is from 2 to 200.

5. The method according to claim 3, wherein the content of the 1,3,3,4,4,5,5-heptafluorocyclopentene in the process gas is 1 to 10 vol %.

* * * * *